United States Patent
Choi et al.

(10) Patent No.: US 11,797,203 B2
(45) Date of Patent: Oct. 24, 2023

(54) MEMORY DEVICE HAVING A PLURALITY OF LOW POWER STATES

(71) Applicant: SAMSUNG ELECTRONICS CO., LTD., Suwon-si (KR)

(72) Inventors: Yeon-kyu Choi, Seoul (KR); Ki-seok Oh, Seoul (KR); Seung-jun Shin, Incheon (KR); Hye-ran Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/903,589

(22) Filed: Sep. 6, 2022

(65) Prior Publication Data

US 2023/0004313 A1 Jan. 5, 2023

Related U.S. Application Data

(63) Continuation of application No. 16/939,789, filed on Jul. 27, 2020, now Pat. No. 11,644,989, which is a continuation of application No. 15/797,525, filed on Oct. 30, 2017, now Pat. No. 10,754,564.

(30) Foreign Application Priority Data

Nov. 1, 2016 (KR) .......................... 10-2016-014483

(51) Int. Cl.
G06F 3/06 (2006.01)
G11C 11/4074 (2006.01)
G11C 11/406 (2006.01)

(52) U.S. Cl.
CPC .......... *G06F 3/0634* (2013.01); *G06F 3/0604* (2013.01); *G06F 3/0625* (2013.01); *G06F 3/0659* (2013.01); *G06F 3/0673* (2013.01); *G11C 11/4074* (2013.01); *G11C 11/40615* (2013.01); *G11C 2211/4067* (2013.01)

(58) Field of Classification Search
None
See application file for complete search history.

(56) References Cited

U.S. PATENT DOCUMENTS

| | | | |
|---|---|---|---|
| 6,515,928 B2 | 2/2003 | Sato et al. | |
| 6,549,479 B2 | 4/2003 | Blodgett | |
| 6,618,791 B1 * | 9/2003 | Dodd | G06F 1/3275 711/105 |
| 6,771,553 B2 | 8/2004 | Cowles et al. | |

(Continued)

FOREIGN PATENT DOCUMENTS

| CN | 1355536 A | 6/2002 |
|---|---|---|
| CN | 1402258 A | 3/2003 |

(Continued)

*Primary Examiner* — Elias Mamo
(74) *Attorney, Agent, or Firm* — Sughrue Mion, PLLC

(57) ABSTRACT

A method and memory device of controlling a plurality of low power states are provided. The method includes: entering a low power mode state, in which memory cell rows of the memory device are refreshed and power consumption is lower than in a self-refresh mode state, in response to a low power state entry command; and exiting the low power mode state based on a low power mode exit latency time that is set in a mode register of the memory device or at least one of an alarm signal and a low power mode exit command.

20 Claims, 12 Drawing Sheets

(56) References Cited

U.S. PATENT DOCUMENTS

| | | | |
|---|---|---|---|
| 6,795,362 B2 * | 9/2004 | Nakai | G11C 11/406 365/228 |
| 6,948,029 B2 | 9/2005 | Yano | |
| 7,000,133 B2 | 2/2006 | Dodd et al. | |
| 7,164,615 B2 | 1/2007 | Park et al. | |
| 7,307,909 B2 | 12/2007 | Matsui et al. | |
| 7,583,551 B2 | 9/2009 | Klein | |
| 7,821,864 B2 | 10/2010 | Totolos, Jr. et al. | |
| 8,161,356 B2 | 4/2012 | Bains et al. | |
| 8,392,650 B2 | 3/2013 | Bains | |
| 8,619,485 B2 | 12/2013 | Klein | |
| 8,659,959 B2 | 2/2014 | Kim et al. | |
| 8,879,346 B2 | 11/2014 | Kam et al. | |
| 8,942,056 B2 | 1/2015 | Ellis et al. | |
| 9,015,389 B2 | 4/2015 | Lee et al. | |
| 10,098,065 B2 * | 10/2018 | Dede | H04W 76/28 |
| 2003/0033473 A1 | 2/2003 | Blodgett | |
| 2003/0182588 A1 | 9/2003 | Dodd et al. | |
| 2003/0193829 A1 | 10/2003 | Morgan et al. | |
| 2005/0078539 A1 | 4/2005 | Schoenfeld et al. | |
| 2005/0093617 A1 | 5/2005 | Min et al. | |
| 2005/0172084 A1 | 8/2005 | Jeddeloh | |
| 2006/0005053 A1 * | 1/2006 | Jones, Jr. | G06F 12/0804 711/E12.04 |
| 2006/0023546 A1 | 2/2006 | Park | |
| 2007/0220530 A1 * | 9/2007 | Hsieh | G06F 1/3203 719/327 |
| 2008/0043562 A1 | 2/2008 | Totolos et al. | |
| 2009/0083479 A1 | 3/2009 | Lee et al. | |
| 2010/0115258 A1 | 5/2010 | Jeon et al. | |
| 2010/0162020 A1 | 6/2010 | Maule et al. | |
| 2010/0165773 A1 | 7/2010 | Lim et al. | |
| 2011/0191530 A1 | 8/2011 | Gonzalez et al. | |
| 2011/0194358 A1 | 8/2011 | Choi | |
| 2011/0246713 A1 | 10/2011 | Bains | |
| 2012/0300563 A1 | 11/2012 | Kim et al. | |
| 2012/0331220 A1 | 12/2012 | Bains | |
| 2014/0089577 A1 | 3/2014 | Lee et al. | |
| 2016/0163377 A1 | 6/2016 | Oh et al. | |
| 2016/0180917 A1 | 6/2016 | Chishti et al. | |
| 2016/0196866 A1 | 7/2016 | Bains | |
| 2017/0278561 A1 | 9/2017 | Oh et al. | |

FOREIGN PATENT DOCUMENTS

| | | |
|---|---|---|
| KR | 10-1203764 B1 | 11/2012 |
| KR | 10-1259697 B1 | 5/2013 |
| KR | 10-20140040581 A | 4/2014 |
| TW | 200601041 A | 1/2006 |
| TW | 200602861 A | 1/2006 |

* cited by examiner

MRS (312)

| CAn | ... | CA3 | CA2 | CA1 | CA0 |
|---|---|---|---|---|---|
| Reserved | | tXP_LPS timing | | | tXP_LPS Auto Exit |

| CA3 | CA2 | CA1 | Function |
|---|---|---|---|
| 0 | 0 | 0 | tXP_LPS1 |
| 0 | 0 | 1 | tXP_LPS2 |
| ⋮ | ⋮ | ⋮ | ⋮ |
| 1 | 1 | 1 | tXP_LPSn |

| CA0 | Function |
|---|---|
| 0 | Disable |
| 1 | Enable |

MEMORY DEVICE HAVING A PLURALITY OF LOW POWER STATES

CROSS-REFERENCE TO THE RELATED APPLICATION

This is a continuation application of U.S. application Ser. No. 16/939,789, filed Jul. 27, 2020, which is a continuation of U.S. application Ser. No. 15/797,525 filed Oct. 30, 2017, which claims priority from Korean Patent Application No. 10-2016-0144483, filed on Nov. 1, 2016, in the Korean Intellectual Property Office, the disclosures of which are herein incorporated by reference in their entireties.

BACKGROUND

Methods and apparatuses consistent with the exemplary embodiments of the inventive concept relate to a memory device, and more particularly, to a memory device maximizing power saving by using a plurality of low power states.

A dynamic random access memory (DRAM) is used as a working memory in computing devices or mobile devices. The working memory provides a temporary storage place for data and programs (or code) to be accessed and executed by a system processor(s). A volatile memory device such as the DRAM performs a refresh operation to retain data bits stored therein.

A refresh operation of the DRAM is controlled by a memory controller. The memory controller cyclically accesses data bits of the DRAM by issuing a refresh command. In addition, the DRAM has a self-refresh mode for reducing power consumption. The self-refresh mode allows a refresh operation to be automatically performed by using an internal counter, and thus, leads to low power consumption. When the DRAM is not accessed for a long time, a self-refresh mode is performed in response to a self-refresh entry command (SRE) and a self-refresh exit command (SRX) by the memory controller.

If power consumption can be further reduced than in the self-refresh mode even while data bits stored in the DRAM are retained, a mobile device including the DRAM would exhibit better performance.

SUMMARY

Exemplary embodiments of the inventive concept provide a method of controlling a power state of a memory device having a plurality of low power states.

The exemplary embodiments of the inventive concept also provide the aforementioned memory device having the plurality of low power states.

According to an exemplary embodiment, there is provided a method of controlling a power state of a memory device, the method including: entering a low power mode state, in which memory cell rows of the memory device are refreshed and power consumption is lower than in a self-refresh mode state, in response to a low power state entry command; and automatically exiting the low power mode state based on a low power mode exit latency time that is set in a mode register of the memory device.

According to an exemplary embodiment, there is provided a method of controlling a power state of a memory device, the method including: entering a low power mode state, in which memory cell rows are refreshed and power consumption is lower than in a self-refresh mode state, in response to a low power state entry command; and receiving at least one of an alarm signal and a low power mode exit command which instruct exit from the low power mode state, wherein the low power mode exit command is received after a low power mode exit latency time elapses, wherein the low power mode exit latency time is a time period after which the memory device automatically exits the low power mode state, and wherein the low power mode exit latency time is set in a mode register of the memory device.

According to an exemplary embodiment, there is provided a method of controlling a power state of a memory device, the method including: entering a low power mode state, in which memory cell rows are refreshed and power consumption is lower than in a self-refresh mode state, in response to a low power state entry command; receiving a trigger signal instructing transition from the low power mode state to a self-refresh mode state; and operating in the self-refresh mode state in response to the trigger signal.

According to an exemplary embodiment, there is provided a memory device including: a memory cell array comprising memory cell rows; and a control logic configured to control a self-refresh mode state in which the memory cell rows are refreshed, and a first low power mode state in which power consumption is lower than in the self-refresh mode state, wherein the control logic controls entry to the first low power mode state in response to a first low power state entry command, and control exit from the first low power mode state based on a first low power mode exit latency time set in a mode register of the memory device.

According to an exemplary embodiment, there is provided a memory device including: a memory cell array comprising memory cells; and a control logic configured to control entry into and exit from an idle state, a first low power mode state and a second low power mode state, wherein, in the first and second power mode state, the memory cells are refreshed, wherein the memory device in the first low power mode consumes less power than in the idle state and more power than in the second low power mode state, and wherein the control logic controls automatic exit from the first low power mode state to the idle state after a first time period, and automatic exit from the second low power mode state to the idle state after a second time period.

BRIEF DESCRIPTION OF THE DRAWINGS

Exemplary embodiments of the inventive concept will be more clearly understood from the following detailed description taken in conjunction with the accompanying drawings, in which.

DETAILED DESCRIPTION OF THE EXEMPLARY EMBODIMENTS

Hereinafter, exemplary embodiments of the inventive concept will be described in detail with reference to the accompanying drawings. It should be understood that the inventive concept may be embodied in different ways without departing from the spirit and scope of the inventive concept. Therefore, it should be understood that the following exemplary embodiments are provided for illustration only and are not to be construed in any way as limiting the inventive concept.

Figure 1:
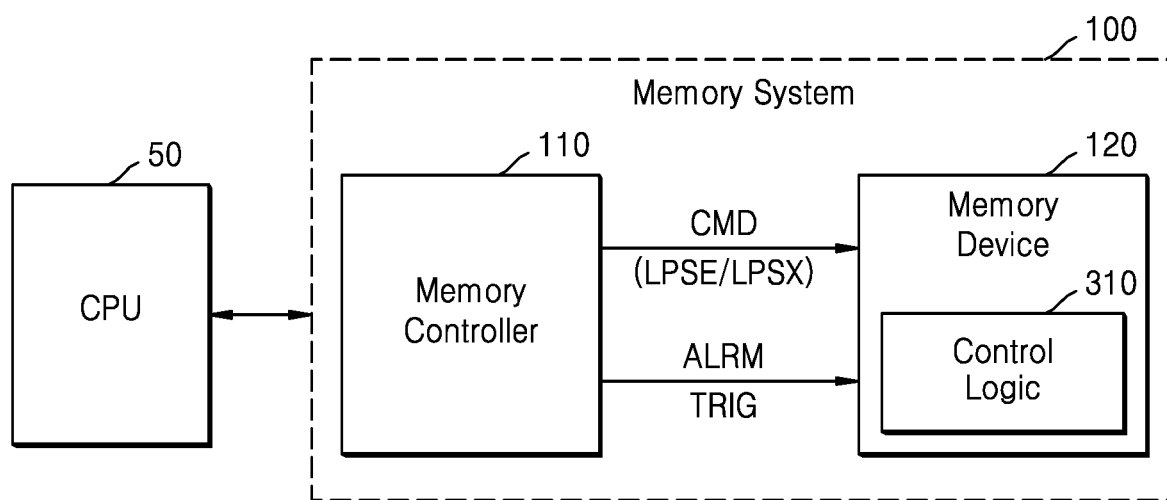
FIG. 1 illustrates a memory system including a memory device that has a plurality of low power states, according to an exemplary embodiment.

FIG. 1 illustrates a memory system including a memory device that has a plurality of low power states, according to an exemplary embodiment.

Referring to FIG. 1, a memory system 100 may be connected to and communicate with a central processing unit (CPU) 50. The memory system 100 may perform at least a write or read operation according to various input/output commands received from the CPU 50. In FIG. 1, the memory system 100 generally includes a memory controller 110 and a memory device 120.

The memory system 100 may perform write/read operations or other memory access operations in response to commands of the CPU 50. If the CPU 50 does not issue any command, the memory system 100 may be in an idle state. The idle state of the memory system 100 may imply that the memory device 120 is in an idle state.

The memory system 100 may determine an operation state of the memory device 120 according to a command CMD of the memory controller 110. The memory device 120 may determine the operation state of the memory device 120 by control logic 310 receiving the command CMD.

For example, the memory device 120 may operate in an active mode state according to an active command ACT, operate in a refresh mode state according to a refresh command REF, operate in a deep power down mode state according to a deep power down command DPD, operate in a self-refresh mode state according to a self-refresh entry command SRE, and operate in a low power mode state according to a low power state entry command LPSE.

The memory device 120 may include a memory cell array, in which a plurality of memory cells are arranged. The control logic 310 may control the self-refresh mode state and the low power mode state to refresh memory cell rows. The control logic 310 may operate or control the memory device 120 in the self-refresh mode state by the self-refresh entry command SRE and the self-refresh exit command SRX. The control logic 310 may control entry to the low power mode state in response to the low power state entry command LPSE. The control logic 310 may control automatic exit from the low power mode state by a low power mode exit latency time tXP_LPS (FIG. 4) set in a mode register, or control exit from the low power mode state in response to an alarm signal ALRM, a trigger signal TRIG, and/or a low power mode exit command LPSX.

Figure 2:
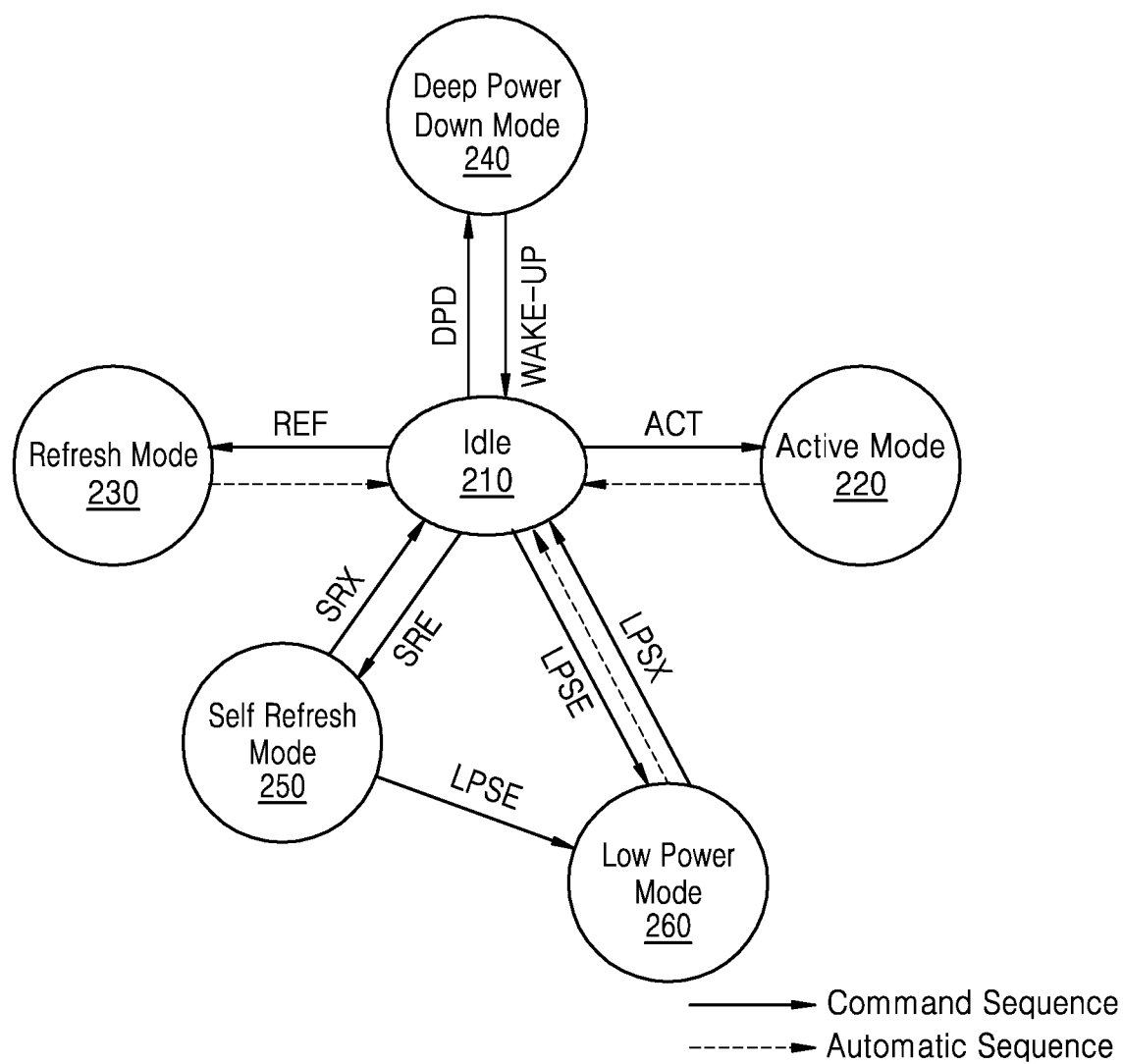
FIG. 2 illustrates an example state diagram of a memory device, according to an exemplary embodiment.

FIG. 2 illustrates an example state diagram of a memory device, according to an exemplary embodiment.

Referring to FIG. 2, the memory device 120 (FIG. 1) may be in one of a plurality of operation mode states. For example, the memory device 120 may have a total of six operation mode states including an idle state 210, an active mode state 220, a refresh mode state 230, a deep power down mode state 240, a self-refresh mode state 250, and a low power mode state 260. In this embodiment, although the six operation mode states will be described, the inventive concept is not limited thereto, and the memory device 120 may have various operation mode states depending upon operations of the memory device 120.

The idle state 210 defines when the memory device 120 does not operate, that is, when the memory device 120 is not accessed. For example, when there is no command of the CPU 50 (FIG. 1), or when the CPU 50 is in a sleep mode, the memory device 120 may be in the idle state 210.

The active mode state 220 represents a state in which the memory device 120 is performing a normal operation such as read, write and other operations in response to the active command ACT. The active mode state 220 is a state in which the memory device 120 exhibits maximum power consumption since all circuits in the memory device 120 are enabled. When the normal operation in the active mode state 220 is completed, the memory device 120 may automatically transit to the idle state 210.

The refresh mode state 230 represents an auto-refresh state, in which the memory device 120 refreshes memory cell rows of a memory cell array in response to the cyclical refresh command REF applied by the memory controller 110. In the refresh mode state 230, considering that a clock signal CK of the memory device 120 is alive and a command of the CPU 50 (FIG. 1) may be issued to the memory device 120, all circuits may be enabled. Thus, power consumption in the refresh mode state 230 may be substantially the same as that in the active mode state 220. When a refresh operation in the refresh mode state 230 is completed, the memory device 120 may automatically transit to the idle state 210.

The deep power down mode state 240 represents a deep power down state, in which the memory device 120 disables most circuits in the memory device 120 in response to the deep power down command DPD. The deep power down mode state 240 is a state in which the memory device 120 exhibits minimum power consumption. In response to a wake-up command WAKE-UP, the memory device 120 may enable the circuits, which have been disabled in the deep power down mode state 240, and may transit to the idle state 210.

The self-refresh mode state 250 represents a self-refresh state, in which the memory device 120 refreshes the memory cell rows of the memory cell array in response to the self-refresh entry command SRE. The self-refresh entry command SRE may be issued by the memory controller 110 (FIG. 1) in order to reduce the power consumption of the memory device 120, when a certain time period elapses while the memory device 120 is in the idle state 210.

In the self-refresh mode state 250, among the circuits in the memory device 120, circuits directly and indirectly related to a self-refresh operation may be enabled, and the other circuits may be disabled. For example, in the self-refresh mode state 250, a clock buffer receiving the clock signal CK from the memory controller 110 may be disabled. In the self-refresh mode state 250, a refresh operation may be performed by using an internal counter (not shown) while the clock signal CK is disabled. Thus, power consumption in the self-refresh mode state 250 may be lower than that in the active mode state 220 and the refresh mode state 230 in which all of the circuits may be enabled. The memory device 120 may exit the self-refresh mode state 250 in response to the self-refresh exit command SRX which may be issued by the memory controller 110.

The low power mode state 260 represents a low power down state, in which power consumption is lower than in the self-refresh mode state 250 although the memory cell rows of the memory cell array are refreshed like in the self-refresh mode state 250. The memory device 120 may transit from the self-refresh mode state 250 to the low power mode state 260 in response to the low power state entry command LPSE. In addition, the memory device 120 may transit from the idle state 210 to the low power mode state 260 in response to the low power state entry command LPSE.

In the low power mode state 260, among the circuits in the memory device 120, only circuits directly related to the self-refresh operation are enabled, and the other circuits may be disabled. For example, in the low power mode state 260, only circuits related to the internal counter, among the circuits enabled in the self-refresh mode state 250, may be enabled. Thus, since the low power mode state 260 controls more circuits to be disabled than the self-refresh mode state 250, power consumption in the low power mode state 260 may be further reduced than in the self-refresh mode state 250.

Figure 3:
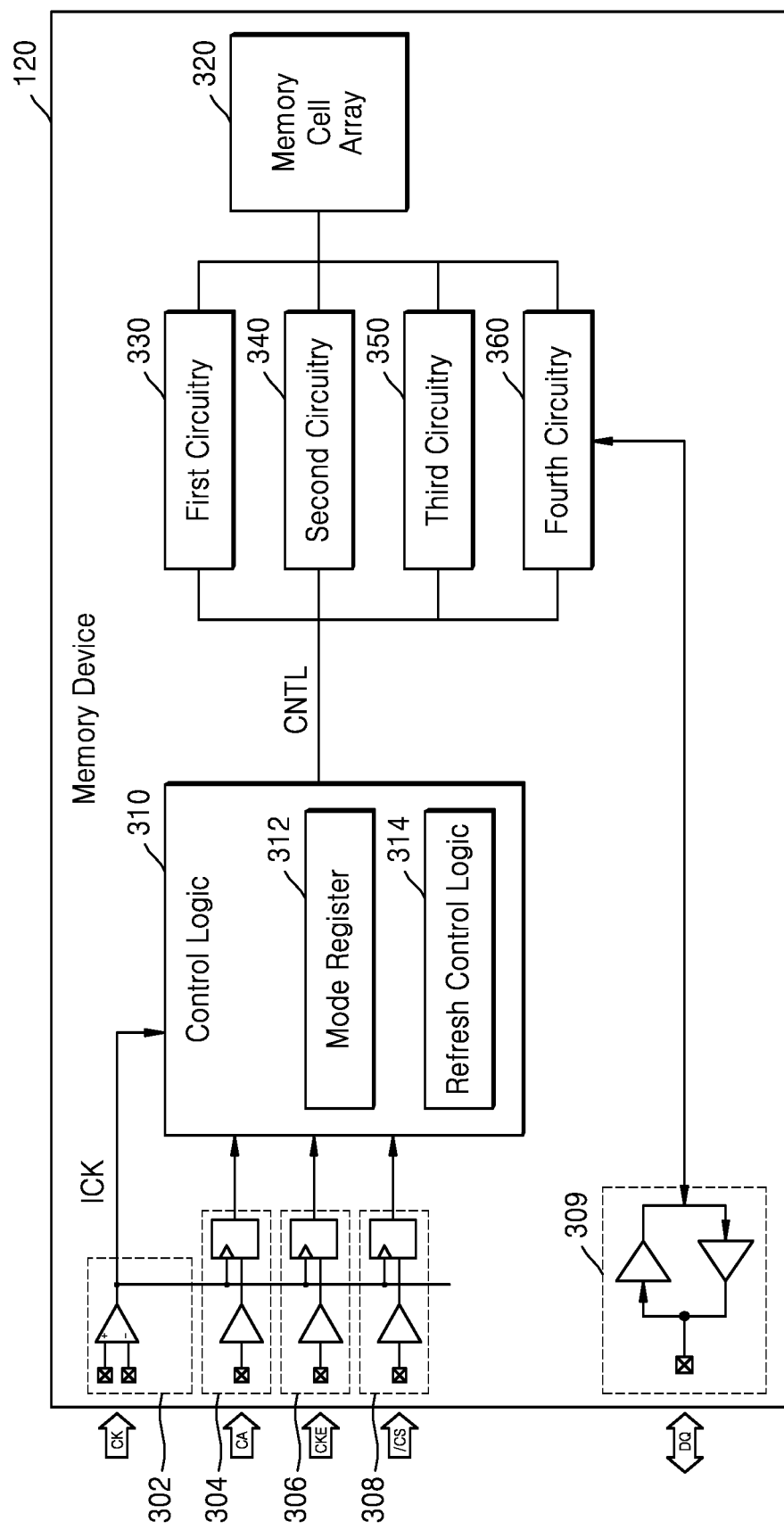
FIG. 3 illustrates an example block diagram of a memory device, according to an exemplary embodiment.

When the self-refresh operation in the low power mode state 260 is completed, the memory device 120 may automatically transit to the idle state 210. Here, the memory device 120 may automatically exit the low power mode state 260 according to the low power mode exit latency time tXP_LPS set in a mode register 312 (FIG. 3). The low power mode exit latency time tXP_LPS is a time period that is set so that there is no influence on the normal operation or the idle state of the memory device 120 by controlling the memory device 120 to exit the low power down state early enough. The memory device 120 may receive a valid command after the low power mode exit latency time tXP_LPS elapses, by using the internal counter or a separate counter (not shown).

According to an exemplary embodiment, the memory device 120 may exit the low power mode state 260 by an alarm signal ALRM2 (FIG. 5) set in a specific pin (PINC) of the memory device 120. For example, the memory device 120 may exit the low power mode state 260 by the alarm signal ALRM2 which is enabled by the specific pin (PINC) earlier as much as the low power mode exit latency time tXP_LPS than a time point at which the low power mode exit command LPSX is applied.

For example, the low power mode exit latency time tXP-LPS may be longer than a self-refresh exit latency time tXP. Since more circuits are disabled in the low power mode state 260 than in the self-refresh mode state 250, it may take more time to enable the circuits disabled in the low power mode state 260. Thus, the low power mode exit latency time tXP-LPS may be relatively long.

FIG. 3 illustrates an example block diagram of a memory device, according to an exemplary embodiment.

Referring to FIG. 3, the memory device 120 (FIG. 1) may include a clock buffer 302, a command/address receiver 304, a clock enable receiver 306, a chip selection receiver 308, a data input/output buffer 309, control logic 310, a memory cell array 320, and first to fourth circuitries 330 to 360.

The clock buffer 302 may receive the clock signal CK from the memory controller 110 (FIG. 1) and generate an internal clock signal ICK. The clock signal CK, together with an inverted clock signal CKB, may be provided as a continuously alternately inverted signal. A pair of clock signals CK and CKB may improve timing accuracy since rising/falling edges may be detected with reference to an intersection point thereof.

The command/address receiver 304 may receive command/address signals CA from the memory controller 110, and may provide the received command/address signals CA to the control logic 310 in response to the internal clock signal ICK. The command/address signals CA may include commands and address signals. The command/address signals CA may be distinguished into commands and address signals by the control logic 310.

The clock enable receiver 306 may receive a clock enable signal CKE, and may provide the received clock enable signal CKE to the control logic 310 in response to the internal clock signal ICK. The clock enable signal CKE may be used as a pseudo command set to logic low, when the memory device 120 enters a power down mode. For example, transition from a self-refresh mode, e.g., the self-refresh mode state 250, to a self-refresh power down mode, e.g., a self-refresh power down mode state 255 (FIG. 5), may be performed by the logic low of the clock enable signal CKE.

The chip selection receiver 308 may receive a chip selection signal/CS, and may provide the received chip selection signal/CS to the control logic 310 in response to the internal clock signal ICK.

The data input/output buffer 309 buffers data input to and output from the memory device 120. In a read operation, the data input/output buffer 309 outputs read data, which is received from the memory cell array 320 through, selectively, at least one of the first to fourth circuitries 330 to 360, to a data input/output terminal DQ. In a write operation, the data input/output buffer 309 may buffer write data received through the data input/output terminal DQ, and may provide the write data to the memory cell array 320 through, selectively, at least one of the first to fourth circuitries 330 to 360.

The control logic 310 may determine operation modes set according to the chip selection signal/CS, the clock enable signal CKE, the command/address signals CA, and combinations thereof, and may generate control signals CNTL controlling the determined operation modes. The control logic 310 may generate a sequence of control signals CNTL depending upon the operation modes.

The control logic 310 may include a mode register 312 and a refresh control logic 314. Although the control logic 310 is described, in this embodiment, as including two components, the mode register 312 and the refresh control logic 314 to conceptually describe the inventive concept, the inventive concept is not limited thereto, and the control logic 310 may include various other circuit components for controlling operation modes of the memory device 120.

Various options, functions, and features according to the operation modes of the memory device 120 may be programmed into the mode register 312. The mode register 312 may be programmed by mode register set (MRS) commands, and may be programmed with user-defined variables. The mode register 312 is divided into various fields depending upon functions and/or operation modes, and contents of the mode register 312 may be updated by re-executing power-up and/or MRS commands.

For example, the mode register 312 may store data for controlling a burst length, a read burst type, column access strobe (CAS) latency, a test mode, a data mask function, a write data bus inversion (DBI) function, a read DBI function, and the like. In addition, the mode register 312 may store the low power mode exit latency time tXP_LPS that is set to automatically exit the low power mode state 260 (FIG. 2).

The refresh control logic 314 may control the self-refresh operation, when the memory device 120 is in the self-refresh mode state 250 or the low power mode state 260. The refresh control logic 314 may control the self-refresh mode state 250 to refresh the memory cell rows in response to the self-refresh entry command SRE and the self-refresh exit command SRX.

The refresh control logic 314 may control the low power mode state 260 to refresh the memory cell rows in response to the low power state entry command LPSE. The refresh control logic 314 may control the memory device 120 to automatically exit the low power mode state 260 by the low power mode exit latency time tXP_LPS set in the mode register 312.

The refresh control logic 314 may receive the alarm signal ALRM2 instructing exit from the low power mode state 260. The refresh control logic 314 may control the memory device 120 to exit the low power mode state 260 by receiving the low power mode exit command LPSX after the low power mode exit latency time tXP_LPS elapses from a time point of receiving the alarm signal ALRM2.

The refresh control logic 314 may receive the trigger signal TRIG instructing transition from the low power mode state 260 to the self-refresh mode state 250. The refresh control logic 314 may control the memory device 120 to operate in the self-refresh mode state 250 in response to the trigger signal TRIG.

The refresh control logic 314 may receive an alarm signal ALRM1 instructing exit from the self-refresh mode state 250. The refresh control logic 314 may control the memory device 120 to exit the self-refresh mode state 250 by receiving the self-refresh exit command SRX after the self-refresh exit latency time tXP elapses from a time point of receiving the alarm signal ALRM1. The self-refresh exit latency time tXP may be set by standards for the memory device 120.

The memory cell array 320 may include DRAM memory cells, each of which includes one access transistor and one storage capacitor. The memory cells are arranged to form a matrix structure of rows and columns, and the memory cells connected to each of the rows may constitute a memory cell row.

The first to fourth circuitries 330 to 360 are internal circuitries of the memory device 120, and are conceptually distinguished circuitries according to the inventive concept. The first to fourth circuitries 330 to 360 may be controlled by the control signals CNTL of the control logic 310, and may be selectively enabled or disabled depending upon the operation modes of the memory device 120.

For example, the first to fourth circuitries 330 to 360 may include a sense amplifier circuit, a column gate, an input/output circuit, a row decoder, a column decoder, and the like, which are related to read and write operations of the memory cell array 320. The row decoder may decode a row address, and the decoded row address may be provided to the memory cell array 320 and operate a word line selected from among a plurality of word lines connected to the memory cells. Data stored in the memory cells connected to the selected word line may be sensed and amplified by the sense amplifier circuit. The column decoder may decode a column address, and the column gate may select bit lines connected to the memory cells by performing column gating according to the decoded column address. The input/output circuit may buffer and provide data read from the memory cell array 320 to the data input/output buffer 309, or may buffer and provide data received through the data input/output buffer 309 to the memory cell array 320.

In addition, the first to fourth circuitries 330 to 360 may include various circuits, such as a data inversion circuit, which recovers data by inverting or non-inverting data received through a data bus and the data input/output buffer 309 in response to an inversion control signal, a data mask circuit, which controls data received through the data input/output buffer 309 not to be selectively written, and the like.

Figure 5:
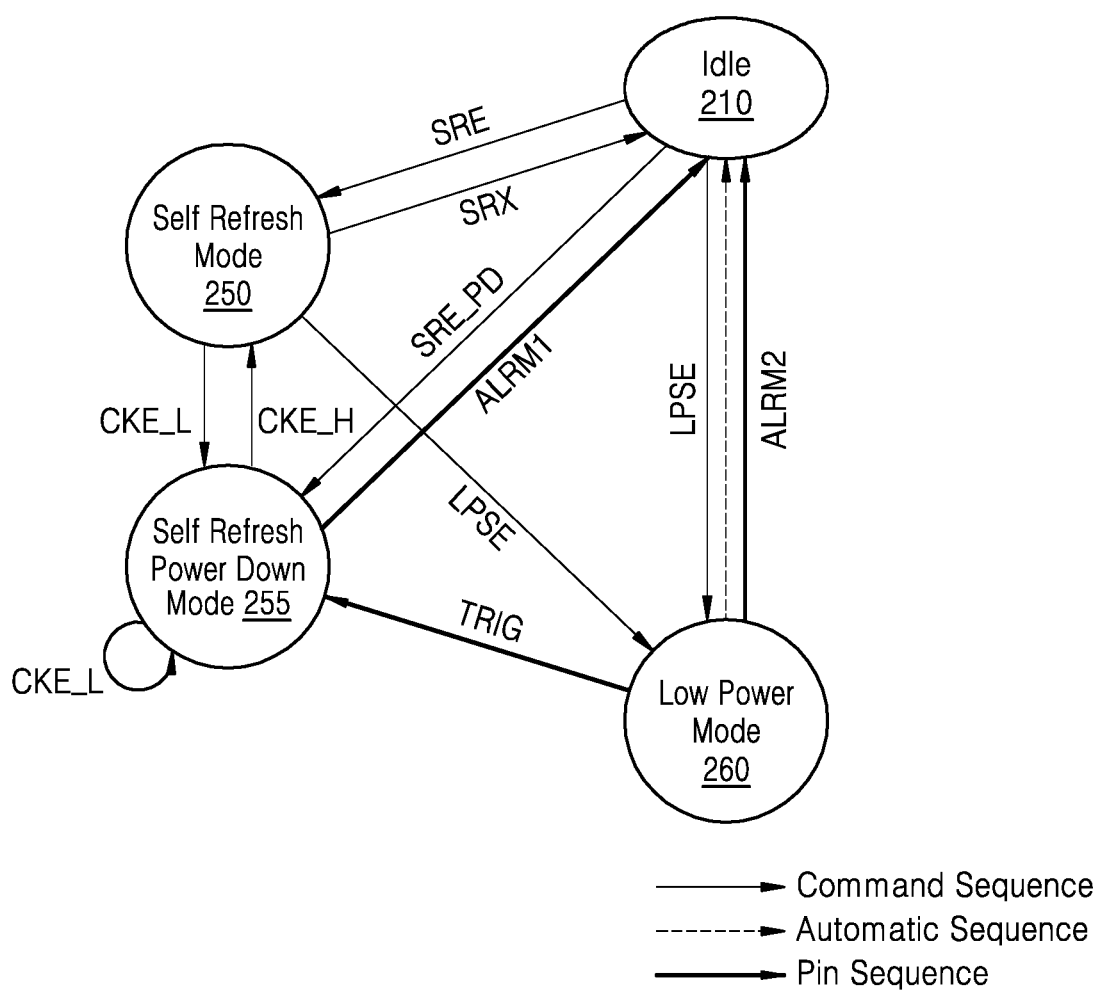
FIG. 5 illustrates a state diagram of a memory device, according to an exemplary embodiment.
Figure 9:
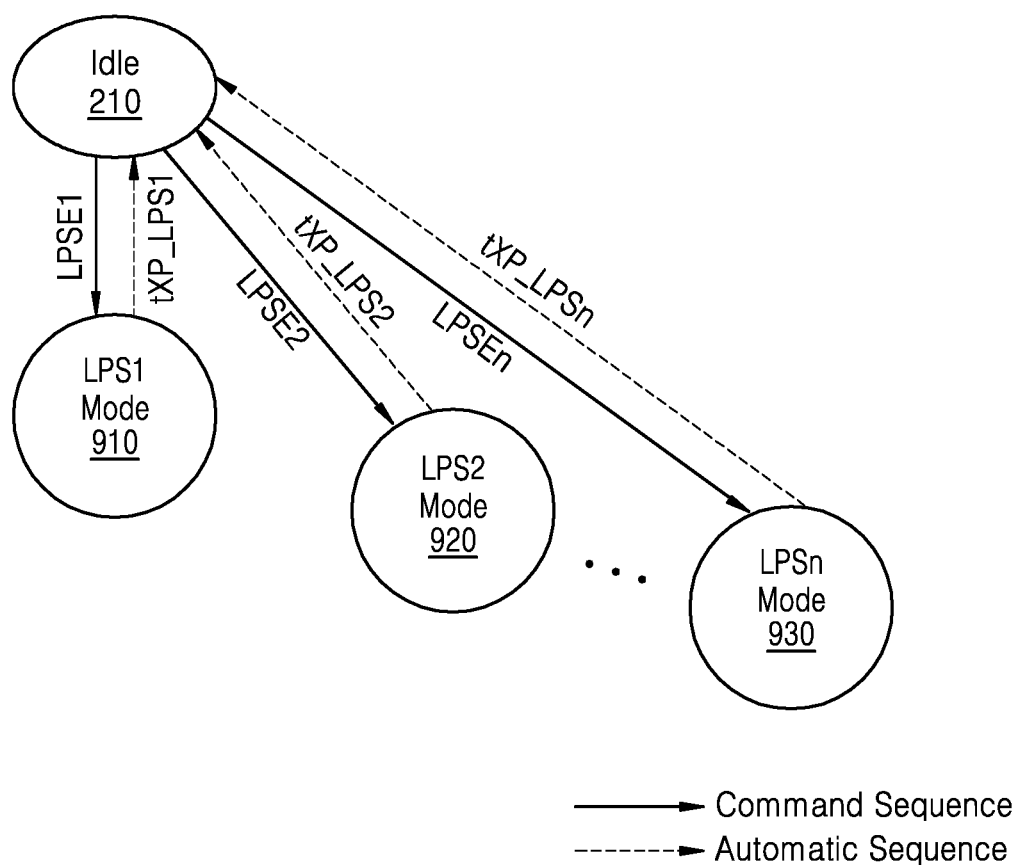
FIG. 9 illustrates an example low power state diagram of a memory device, according to an exemplary embodiment.

In this embodiment, it should be noted that circuits, which are simultaneously enabled depending upon the operation modes of the memory device 120 described with reference to FIGS. 2, 5, and 9, are collectively referred to as each of the first to fourth circuitries 330 to 360, for convenience.

For example, the first to fourth circuitries 330 to 360 may be circuits enabled in the idle state 210, in the active mode state 220, and in the refresh mode state 230. The first to third circuitries 330 to 350 may be circuits enabled in the self-refresh mode state 250. The first and second circuitries 330 and 340 may be circuits enabled in the low power mode state 260. In the deep power down mode state 240, all of the first to fourth circuitries 330 to 360 may be disabled.

Figure 4:
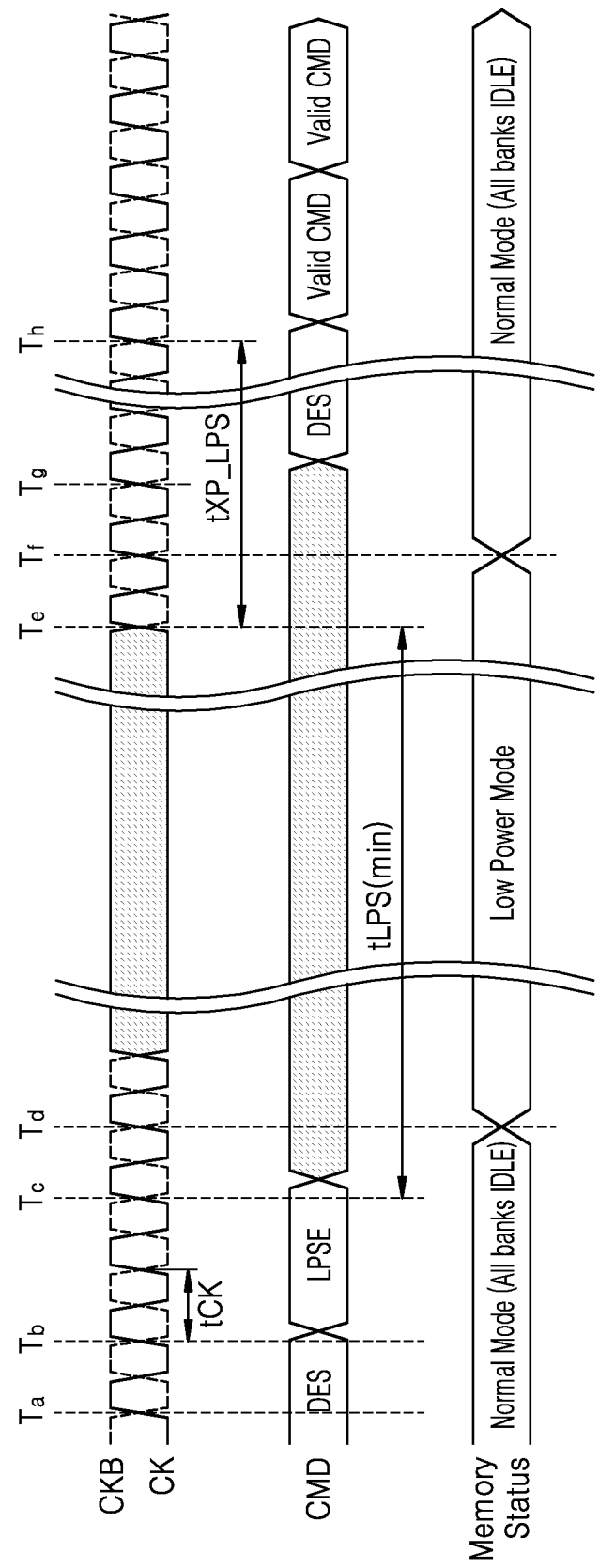
FIG. 4 is a timing diagram of a memory device operating in a low power mode state, according to an exemplary embodiment.

FIG. 4 is a timing diagram of a memory device operating in a low power mode state, according to an exemplary embodiment. Low power mode entry and low power mode automatic exit will be described with reference to FIG. 4. It should be noted that timing diagrams described in exemplary embodiments of the inventive concept are not always shown in scale.

Referring to FIGS. 3 and 4, the memory device 120 may receive a pair of clock signals CK and CKB. A frequency of the pair of clock signals CK and CKB may be set to be relatively high. Thus, a command CMD synchronized with the pair of clock signals CK and CKB may be input throughout two clock cycles (2*tCK), considering the high clock frequency. Although synchronized with an edge of the pair of clock signals CK and CKB, the command CMD will be actually shown as being delayed for a certain time period from the edge of the pair of clock signals CK and CKB in the timing diagrams due to the high clock frequency. The pair of clock signals CK and CKB will be collectively referred to as the clock signal CK, for convenience.

The clock signal CK is received from a time point Ta. A rising edge of the clock signal CK is input at the time point Ta, and may also be input at each of time points Tb, Tc, Td, Te, Tf, Tg, and Th. At the time point Ta, a device deselected (DES) command may be received. The DES command may be applied after the lapse of a certain time period, before the application of power voltage and reference voltages, the stabilization of the clock signal CK, and the application of an executable command. In this embodiment, the memory device 120 is described as operating in response to the rising edge of the clock signal CK. According to an exemplary embodiment, the memory device 120 may operate in response to a falling edge of the clock signal CK.

At the time point Tb, the low power state entry command LPSE is received. The low power state entry command LPSE may be received throughout two clock cycles (2*tCK) from the time point Tb to the time point Tc.

The memory device 120 may transit to the low power mode state 260 (FIG. 2), for example, at the time point Td, in response to the low power state entry command LPSE. The memory device 120 before the low power mode state 260 may be in a normal mode state, in which all banks are in an idle state. In the low power mode state 260, the memory cell rows of the memory cell array 320 may be refreshed, like in the self-refresh mode state 250 (FIG. 2). In the low power mode state 260, the clock signal CK may be disabled.

From the time point Te, the memory device 120 may automatically exit the low power mode state 260. The time point Te may be determined by the low power mode exit latency time tXP_LPS set in the mode register 312.

After the low power mode exit latency time tXP_LPS elapses from the time point Te, the memory device 120 may receive a valid command. For example, from the time point Th, the memory device 120 may receive the valid command.

The memory device 120 may exit the low power mode state 260 and thus transit to the normal mode state, in which all of the banks are in an idle state, for example, at the time point Tf.

At the time point Tg, the memory device 120 may receive the DES command before receiving the valid command.

In FIG. 4, a low power mode state time tLPS, for which the memory device 120 is in the low power mode state 260, may be determined as a time period from the time point Tc of receiving the low power state entry command LPSE to the time point Te of automatically exiting the low power mode state.

Since an interval, during which the memory device 120 operates in the low power mode state 260, is internally controlled by the memory device 120, actual start and end time points may not be known. However, the interval, during which the memory device 120 operates in the low power mode state 260, is associated with the low power mode state time tLPS, and thus, may be anticipated as an interval from the time point Td to the time point Tf.

FIG. 5 illustrates a state diagram of a memory device according to an exemplary embodiment. FIG. 5 specifically illustrates a state diagram of the memory device 120 (FIG. 1) described with reference to FIG. 2.

Referring to FIG. 5, the idle state 210, the self-refresh mode state 250, and the low power mode state 260 of the memory device 120 are the same as described with reference to FIG. 2. The memory device 120 enters the self-refresh mode state 250 from the idle state 210 in response to the self-refresh entry command SRE, and exits the self-refresh mode state 250 in response to the self-refresh exit command SRX.

The memory device 120 may transit from the self-refresh mode state 250 to a self-refresh power down mode state 255 in response to the logic low of the clock enable signal CKE. The memory device 120 may also transit from the idle state 210 to the self-refresh power down mode state 255 by a self-refresh power down command SRE-PD.

The self-refresh power down mode state 255 represents a power down state by the clock enable signal CKE in a self-refresh state, in which the memory cell rows of the memory cell array 320 are refreshed. In the self-refresh power down mode state 255, the clock signal CK (FIG. 3) may be disabled according to the logic low of the clock enable signal CKE. Thus, since the clock buffer 302 (FIG. 3) is disabled and the internal clock signal ICK (FIG. 3) is disabled, the power consumption in the self-refresh power down mode state 255 may be lower than that in the self-refresh mode state 250.

The memory device 120 may transit from the self-refresh power down mode state 255 to the self-refresh mode state 250 in response to logic high of the clock enable signal CKE. The memory device 120 may exit the self-refresh power down mode state 255 and transit to the idle state 210 by using the first alarm signal ALRM1 applied to a first pin PINA.

The first alarm signal ALRM1 is a signal provided so that there is no influence on the normal operation or the idle state of the memory device 120 by controlling the memory device 120 to exit the self-refresh power down mode state 255 early enough. That is, the first alarm signal ALRM1 is a signal controlling the memory device 120 to exit the self-refresh power down mode state 255, and then, receive a first valid command. For example, the first alarm signal ALRM1 may be provided earlier as much as the self-refresh exit latency time tXP than a time point at which the self-refresh exit command SRX is applied.

The first pin PINA may be one of a plurality of pins, to which signals used for operations of the memory device 120 are applied. The first pin PINA may be a signal pin which is not used in the self-refresh power down mode state 255 of the memory device 120. For example, the first pin PINA may be one of a data inversion signal pin DBI and a data mask signal pin DM of the memory device 120.

The memory device 120 may transit from the idle state 210 or the self-refresh mode state 250 to the low power mode state 260 in response to the low power state entry command LPSE.

In the low power mode state 260, the memory cell rows of the memory cell array 320 may be refreshed, like in the self-refresh mode state 250 and the self-refresh power down mode state 255. Since there are more circuits disabled in the low power mode state 260 than in the self-refresh power down mode state 255, power consumption in the low power mode state 260 may be lower than that in the self-refresh power down mode state 255. The memory device 120 may transit from the low power mode state 260 to the self-refresh power down mode state 255 by using the trigger signal TRIG applied to a second pin PINB.

The trigger signal TRIG is a signal to enable the memory device 120 to more quickly exit the low power mode state 260. During the low power mode exit latency time tXP_LPS, circuits disabled in the low power mode state 260 may be enabled. The low power mode exit latency time tXP_LPS may be longer than the self-refresh exit latency time tXP. Thus, the trigger signal TRIG controls the memory device 120 to transit from the low power mode state 260 to the self-refresh power down mode state 255, and thus, to exit the low power mode state 260 according to the self-refresh exit latency time tXP that is relatively short.

The second pin PINB may be one of the plurality of pins, to which the signals used for operations of the memory device 120 are applied. The second pin PINB may be a signal pin that is not used in the low power mode state 260. For example, the second pin PINB may be one of the data inversion signal pin DBI and the data mask signal pin DM of the memory device 120.

The memory device 120 may automatically exit the low power mode state 260 according to the low power mode exit latency time tXP_LPS, which is set in the mode register 312, and may transit to the idle state 210. In addition, the memory device 120 may exit the low power mode state 260 and transit to the idle state 210 by using the second alarm signal ALRM2 applied to the third pin PINC.

The second alarm signal ALRM2 is a signal provided so that there is no influence on the normal operation or the idle state of the memory device 120 by controlling the memory device 120 to exit the low power mode state 260 early enough. That is, the second alarm signal ALRM2 is a signal controlling the memory device 120 to exit the low power mode state 260, and then, receive a first valid command. For example, the second alarm signal ALRM2 may be provided earlier as much as the low power mode exit latency time tXP_LPS than a time point at which the low power mode exit command LPSX is applied.

The third pin PINC may be one of the plurality of pins, to which the signals used for operations of the memory device 120 are applied. The third pin PINC may be a signal pin that is not used in the low power mode state 260. For example, the third pin PINC may be one of the data inversion signal pin DBI and the data mask signal pin DM of the memory device 120.

Figure 6:
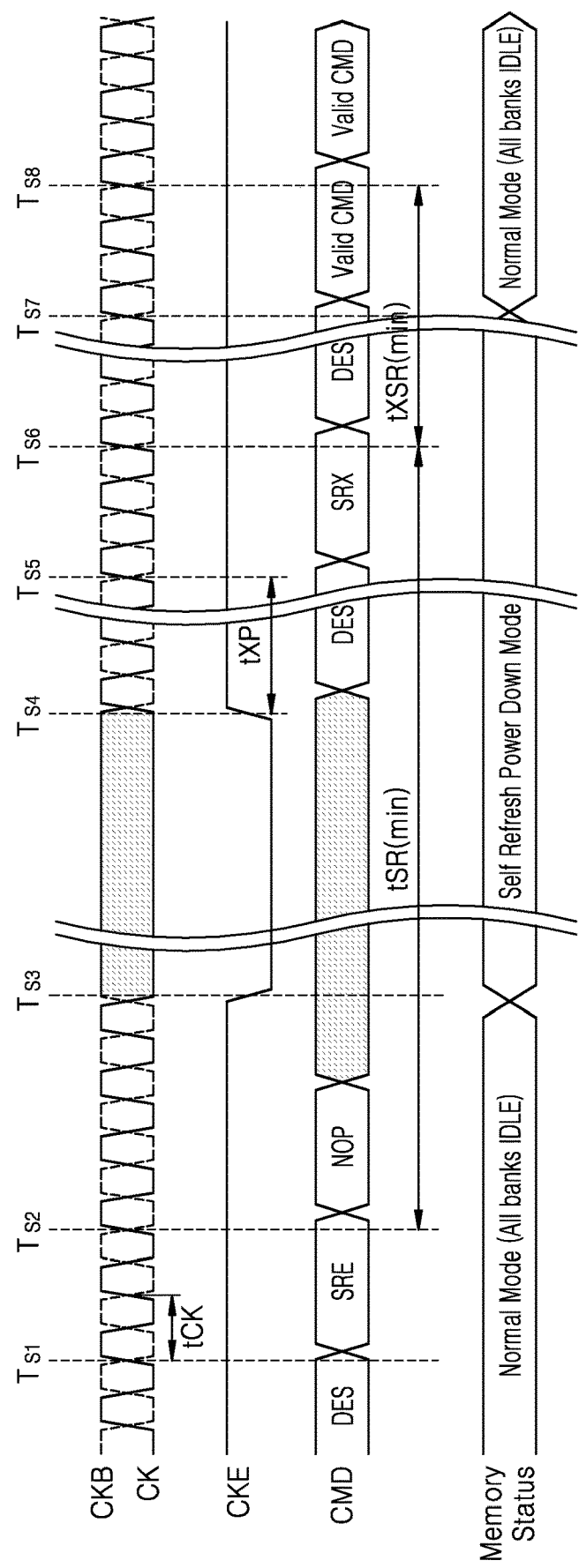
FIG. 6 is a timing diagram of a memory device operating in a self-refresh power down mode, according to an embodiment.

FIG. 6 is a timing diagram of a memory device operating in the self-refresh power down mode of FIG. 5, according to an exemplary embodiment.

Referring to FIGS. 5 and 6, at a time point $T_{S1}$, the self-refresh entry command SRE is received. The self-refresh entry command SRE may be received throughout two clock cycles (2*tCK) from the time point $T_{S1}$ to a time point $T_{S2}$. At the time point $T_{S2}$, no-operation NOP may be illustrated.

At a time point $T_{S3}$, as the clock enable signal CKE transits to logic low, the memory device 120 may transit to the self-refresh power down mode state 255. Here, the clock signal CK may be disabled during a logic low interval of the clock enable signal CKE. During the logic low interval of the clock enable signal CKE, the clock buffer 302 (FIG. 3) may be disabled, and thus, the clock signal CK may be disabled.

At a time point $T_{S4}$, the clock enable signal CKE transits to logic high. The time point $T_{S4}$ may be set based on the self-refresh exit latency time tXP which is before a time point when the self-refresh exit command SRX is applied.

After the self-refresh exit latency time tXP elapses from the time point $T_{S4}$, at a time point $T_{S5}$, the self-refresh exit command SRX is received. The self-refresh exit command SRX may be received throughout two clock cycles (2*tCK) from the time point $T_{S5}$ to a time point $T_{S6}$.

At a time point $T_{S7}$, the memory device receives a valid command. The valid command may be received throughout two clock cycles (2*tCK) from the time point $T_{S7}$ to a time point $T_{S8}$. Before receiving the valid command, the memory device 120 may receive a DES command.

In FIG. 6, a self-refresh time tSR, during which the memory device 120 performs self-refresh, may be determined as a time period from the time point $T_{S2}$ of the self-refresh entry command SRE to the time point $T_{S6}$ of the self-refresh exit command SRX. The self-refresh time tSR may be set as a minimum time period (tSR(min)) by standards. Delay time tXSR from the time point $T_{S6}$ of the self-refresh exit command SRX to the time point $T_{S8}$ of receiving the valid command may also be set as a minimum time period (tXSR (min)) by the standards.

Since an interval, during which the memory device 120 operates in the self-refresh power down mode state 255, is internally controlled by the memory device 120, actual start and end time points may not be known. However, the interval, for which the memory device 120 operates in the self-refresh power down mode state 255, may be anticipated as a time period from the time point $T_{S3}$, at which the clock enable signal CKE transits to logic low, to the time point $T_{S7}$ of receiving the valid command.

Figure 7:
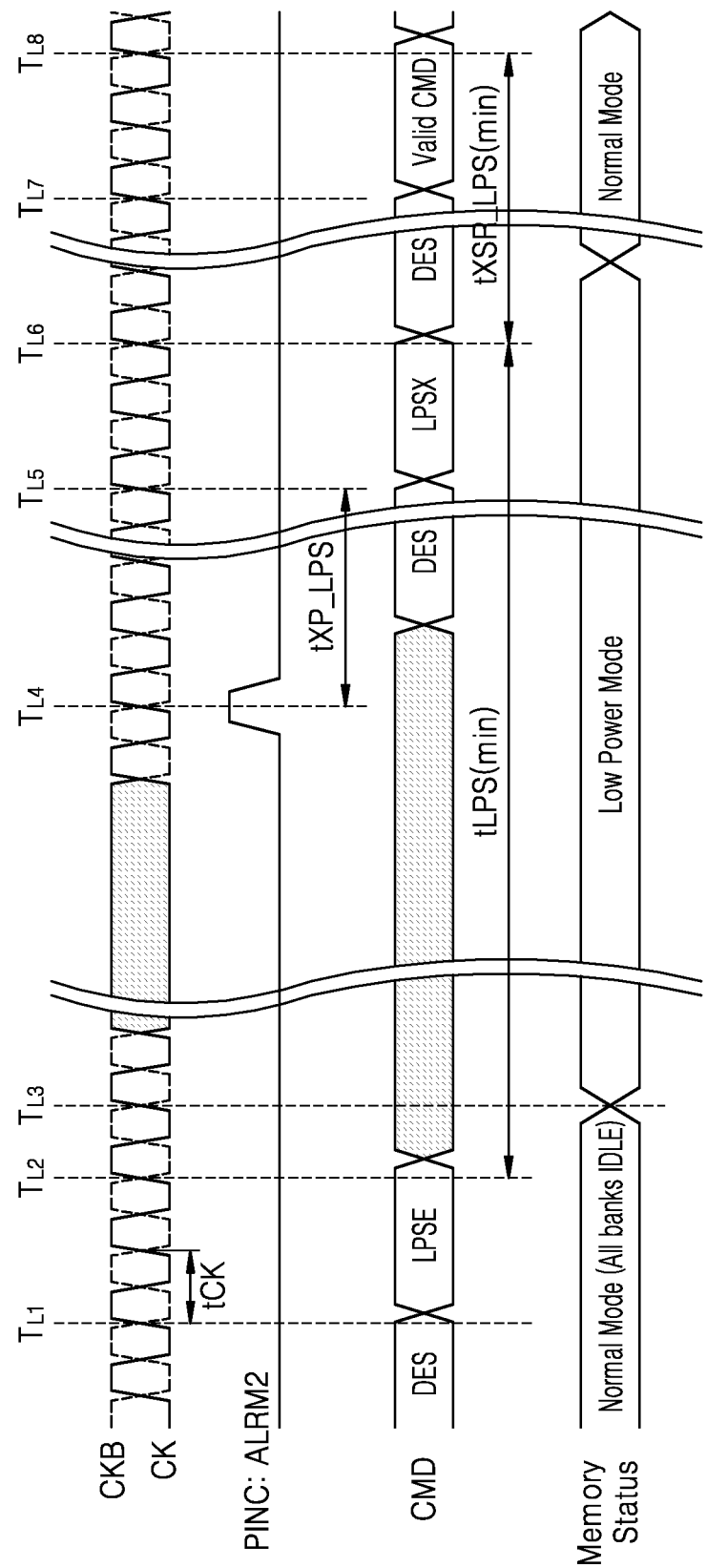
FIGS. 7 and 8 are timing diagrams of a memory device operating in a low power mode state, according to exemplary embodiments.
Figure 8:
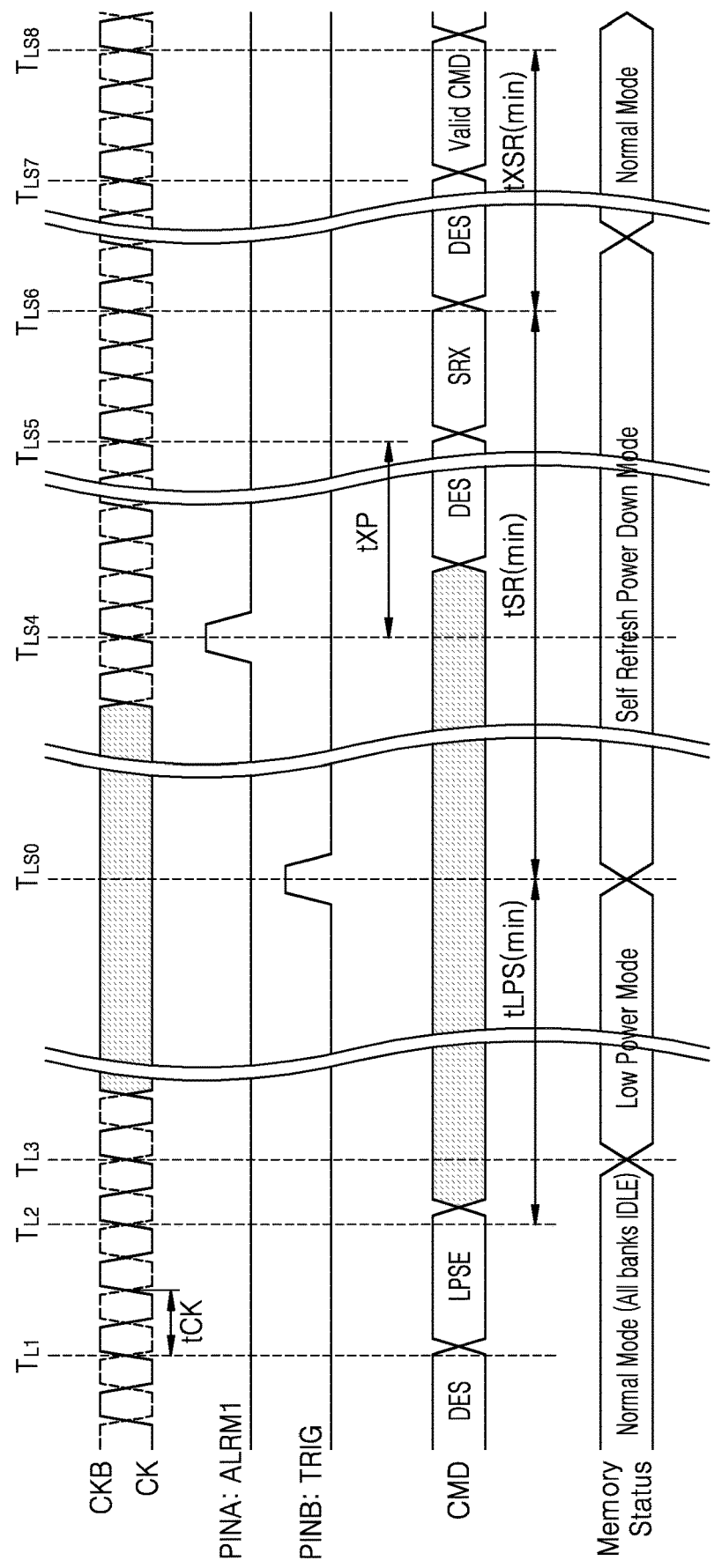

FIGS. 7 and 8 are timing diagrams of a memory device operating in the low power mode state of FIG. 5. FIG. 7 illustrates a timing diagram, in which the memory device 120 transits from the low power mode state 260 to the idle state 210, and FIG. 8 illustrates a timing diagram, in which the memory device 120 transits from the low power mode state 260 to the self-refresh power down mode state 255.

Referring to FIGS. 5 and 7, at a time point $T_{L1}$, the low power state entry command LPSE is received. The low power state entry command LPSE may be received throughout two clock cycles (2*tCK) from the time point $T_{L1}$ to a time point $T_{L2}$. For example, the memory device 120 may transit to the low power mode state 260 at a time point $T_{L3}$ in response to the low power state entry command LPSE.

At a time point $T_{L4}$, the third pin PINC of the memory device 120 receives the second alarm signal ALRM2. The time point $T_{L4}$ may be set based on the low power mode exit latency time tXP_LPS which is before a time point when the low power state entry command LPSE is applied.

For example, the third pin PINC is a signal pin that is not used in the low power mode state 260 of the memory device 120, and may be one of the data inversion signal pin DBI and the data mask signal pin DM. The second alarm signal ALRM2 may be provided so that there is no influence on the normal operation or the idle state of the memory device 120 by controlling the memory device 120 to exit the low power mode state 260 early enough.

After the low power mode exit latency time tXP_LPS elapses from the time point $T_{L4}$, at a time point $T_{L5}$, the low power mode exit command LPSX is received. The low power mode exit command LPSX may be received throughout two clock cycles (2*tCK) from the time point $T_{L5}$ to a time point $T_{L6}$.

At a time point $T_{L7}$, the memory device 120 receives a valid command. The valid command may be received throughout two clock cycles (2*tCK) from the time point $T_{L7}$ to a time point $T_{L8}$. Before receiving the valid command, the memory device 120 may receive a DES command.

In FIG. 7, the low power mode state time tLPS, during which the memory device 120 is in the low power mode state 260, may be determined as a time period from the time point $T_{L2}$ of receiving the low power state entry command LPSE to the time point $T_{L6}$ of the low power mode exit command LPSX. The low power mode state time tLPS may be set as a minimum time period (tLPS(min)) by the standards. Delay time tXSR LPS from the time point $T_{L6}$ of receiving the low power mode exit command LPSX to the time point $T_{L8}$ of receiving the valid command may also be set as a minimum time period (tXSR LPS(min)) by the standards.

Since an interval, during which the memory device 120 operates in the low power mode state 260, is internally controlled by the memory device 120, actual start and end time points may not be known. However, the interval, during which the memory device 120 operates in the low power mode state 260, is associated with the low power mode state time tLPS, and thus, may be anticipated as, for example, an interval from the time point $T_{L3}$ of entering the low power mode state 260 to a time point of receiving the DES command before the reception of the valid command.

Referring to FIGS. 5 and 8, at the time point $T_{L1}$, the low power state entry command LPSE is received. The low power state entry command LPSE may be received throughout two clock cycles (2*tCK) from the time point $T_{L1}$ to the time point $T_{L2}$.

The memory device 120 may transit to the low power mode state 260, for example, at the time point $T_{L3}$, in response to the low power state entry command LPSE.

At a time point $T_{LS0}$, the second pin PINB of the memory device 120 receives the trigger signal TRIG. The trigger signal TRIG may be provided for the memory device 120 to more quickly exit the low power mode state 260. By the trigger signal TRIG, the memory device 120 may transit from the low power mode state 260 to the self-refresh power down mode state 255. The second pin PINB is a signal pin that is not used in the low power mode state 260 of the memory device 120, and may be one of the data inversion signal pin DBI and the data mask signal pin DM.

At a time point $T_{LS4}$, the first pin PINA of the memory device 120 receives the first alarm signal ALRM1. The time point $T_{LS4}$ may be set based on the self-refresh exit latency time tXP which is before a time point when the self-refresh exit command SRX is applied. The first pin PINA is a signal pin that is not used in the self-refresh power down mode state 255 of the memory device 120, and may be one of the data inversion signal pin DBI and the data mask signal pin DM. The first alarm signal ALRM1 may be provided so that there is no influence on the normal operation or the idle state of the memory device 120 by controlling the memory device 120 to exit the self-refresh power down mode state 255 early enough.

After the self-refresh exit latency time tXP elapses from the time point $T_{LS4}$, at a time point $T_{LS5}$, the self-refresh exit command SRX is received. The self-refresh exit command SRX may be received throughout two clock cycles (2*tCK) from the time point $T_{LS5}$ to a time point $T_{LS6}$.

At a time point $T_{LS7}$, the memory device 120 receives a valid command. The valid command may be received throughout two clock cycles (2*tCK) from the time point $T_{LS7}$ to a time point $T_{LS8}$. Before receiving the valid command, the memory device 120 may receive a DES command.

In FIG. 8, the low power mode state time tLPS, during which the memory device 120 is in the low power mode state 260, may be determined as a time period from the time point $T_{L2}$ of receiving the low power state entry command LPSE to the time point $T_{LS0}$ of receiving the trigger signal TRIG. The self-refresh time tSR, during which the memory device 120 performs self-refresh, may be determined as a time period from the time point $T_{LS0}$ of receiving the trigger signal TRIG to the time point $T_{LS6}$ of receiving the self-refresh exit command SRX.

Operations of the memory device 120 in the low power mode state 260 may be performed according to timing parameters set in the standards. By the standards, the low power mode time tLPS may be set as a minimum time period (tLPS(min)), and the self-refresh time tSR may also be set as a minimum time period (tSR(min)). The delay time tXSR from the time point $T_{LS6}$ of receiving the self-refresh exit command SRX to the time point $T_{LS8}$ of receiving the valid command may also be set as a minimum time period (tXSR (min)) by the standards.

After transiting from the low power mode state 260 to the self-refresh power down mode state 255 by the trigger signal TRIG, the memory device 120 according to this embodiment may exit the low power mode state 260 according to the self-refresh exit latency time tXP that is relatively short.

FIG. 9 illustrates an example low power state diagram of a memory device, according to an exemplary embodiment. FIG. 9 specifically illustrates the low power mode state of the memory device 120 (FIG. 1) described with reference to FIGS. 2 and 5.

Referring to FIG. 9, the memory device 120 may be in one of a plurality of low power mode states 910, 920, and 930. The memory device 120 may enter a first low power mode state 910 from the idle state 210 in response to a first low power state entry command LPSE1. The memory device 120 may enter a second low power mode state 920 from the idle state 210 in response to a second low power state entry command LPSE2, and may enter an n-th low power mode state 930 from the idle state 210 in response to an n-th low power state entry command LPSEn.

Among the first to n-th low power mode states 910, 920, and 930, a state allowing the lowest power consumption is assumed to be the n-th low power mode state 930. Previously, in the descriptions with reference to FIG. 3, the first and second circuitries 330 and 340 among the first to fourth circuitries 330 to 360 have been described as being enabled in the low power mode state 260.

For example, the first and second circuitries 330 and 340 may be enabled in the first low power mode state 910. In the second low power state 920, the first circuitry 330 may be enabled, and the second circuitry 340 may be disabled. In the n-th low power mode state 930, all of the first and second circuitries 330 and 340 may be disabled.

The memory device 120 may automatically exit each of the first to n-th low power mode states 910, 920, and 930 by using the low power mode exit latency time tXP_LPS, and thus, may transit to the idle state 210.

For example, in the first low power mode state 910, before a valid command is applied to the memory device 120, first low power mode exit latency time tXP_LPS1 may be required. In the second low power mode state 920, before a valid command is applied, second low power mode exit latency time tXP_LPS2 may be required. The second low power mode exit latency time tXP_LPS2 may be a time period taken to enable the second circuitry 340 that is disabled. In the n-th low power mode state 930, before a valid command is applied, n-th low power mode exit latency time tXP_LPSn, which is taken to enable the first and second circuitries 330 and 340 that are disabled, may be required.

The n-th low power mode exit latency time tXP_LPSn will be relatively longer than the second low power mode exit latency time tXP_LPS2. Likewise, the second low power mode exit latency time tXP_LPS2 will be relatively longer than the first low power mode exit latency time tXP_LPS1. The first to n-th low power mode exit latency times tXP_LPS1 to tXP_LPSn may be set in the mode register 312.

Figure 10:
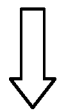
FIG. 10 illustrates an example mode register setting low power mode exit latency times, according to an exemplary embodiment.
Figure 10:
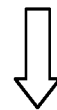

FIG. 10 illustrates an example mode register setting low power mode exit latency times, according to an exemplary embodiment. The mode register 312 of FIG. 10 is used to program various functions, features, and modes of the memory device, and FIG. 10 illustrates bit allocation according to a low power mode.

Referring to FIG. 10, when an MRS command is issued, the mode register 312 may be programmed with bit values provided as command/address signals (CA[0:n]). For example, a CA0 bit is used for setting automatic exit from a low power mode state. If a value of "0" is programmed into the CA0 bit, the automatic exit from the low power mode state is disabled. If a value of "1" is programmed into the CA0 bit, the automatic exit from the low power mode state is enabled.

The low power mode exit latency time tXP_LPS may be set by, for example, 3-bit CA[3:1] bits. If a value of "111" is programmed into the CA[3:1] bits, the first low power mode exit latency time tXP_LPS1 may be set; if a value of "001" is programmed into the CA[3:1] bits, the second low power mode exit latency time tXP_LPS2 may be set; and if a value of "111" is programmed into the CA[3:1] bits, the n-th low power mode exit latency time tXP_LPSn may be set. The n-th low power mode exit latency time tXP_LPSn will be set as a longer time period than the first and second low power mode exit latency times tXP_LPS1 and tXP_LPS2.

Figure 11:
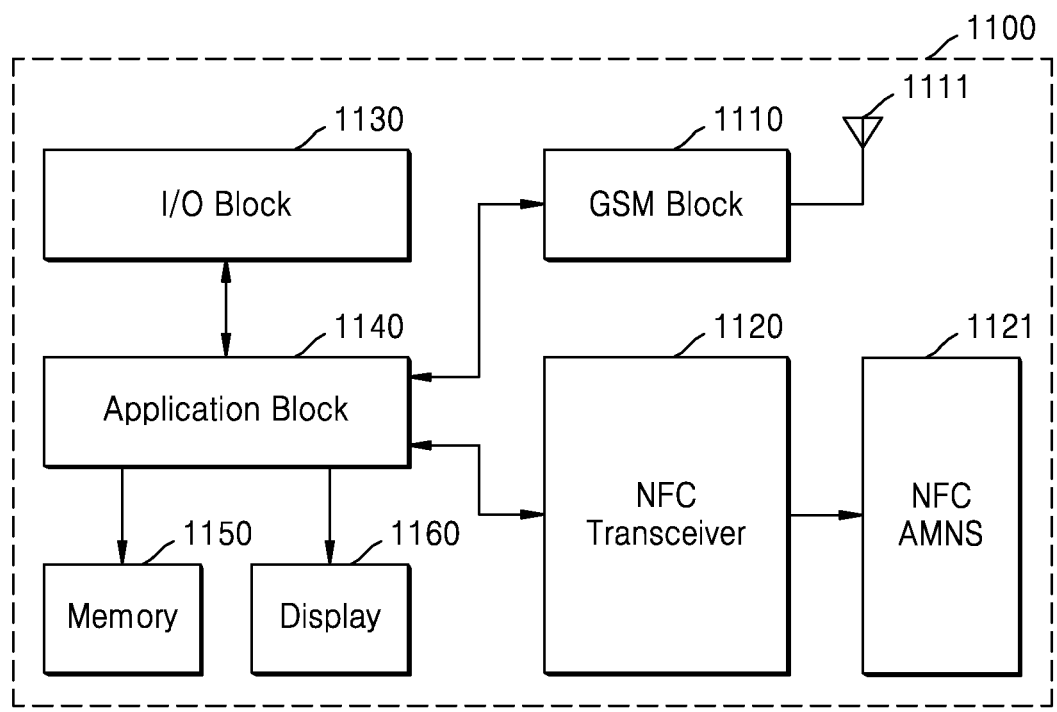
FIG. 11 is a block diagram of an example mobile device, to which a memory device having a plurality of low power states is applied, according to an exemplary embodiment.

FIG. 11 is a block diagram of an example mobile device, to which a memory device having a plurality of low power states is applied, according to an exemplary embodiment. The mobile device may be a mobile phone or a smart phone.

Referring to FIG. 11, a mobile device 1100 includes a global system for mobile communication (GSM) block 1110, a near field communication (NFC) transceiver 1120, an input/output block 1130, an application block 1140, a memory 1150, and a display 1160. In FIG. 11, the components/blocks of the mobile device 1100 are shown by way of example. The mobile device 1100 may include more components/blocks or less components/blocks. In addition, although GSM technology is shown as being used in this embodiment, the mobile device 1100 may be realized by using other technologies such as code division multiple access. The blocks of FIG. 11 will be realized in the form of an integrated circuit.

The GSM block 1110 is connected to an antenna 1111, and may operate to provide wireless phone operations in a manner known in the art. The GSM block 1110 includes a receiver and a transmitter therein to perform reception and transmission operations.

The NFC transceiver 1120 may be configured to transmit and receive NFC signals by using inductive coupling, for wireless communication. The NFC transceiver 1120 may provide the NFC signals to an NFC antenna matching network system 1121, and the NFC antenna matching network system 1121 may transmit the NFC signals by inductive coupling.

The NFC antenna matching network system 1121 may receive NFC signals provided by other NFC devices, and may provide the received NFC signals to the NFC transceiver 1120. The transmission and reception of the NFC signals by the NFC transceiver 1120 may be performed in a time division manner. The NFC transceiver 1120 may operate in accordance with regulations, which are described in NFC interface and protocol-1 (NFCIP-1) and NFC interface and protocol-2 (NFCIP-2) and are standardized in ECMA-340, ISO/IEC 18092, ETSI TS 102 190, ISO 21481, ECMA 352, ETSI TS 102 312, and the like.

The application block 1140 may include hardware circuits, for example, one or more processors, and may operate to provide various user applications provided by the mobile device 1100. The user applications may include voice call operations, data transmission, data swap, and the like. The application block 1140 may provide operation features of the GSM block 1110 and/or the NFC transceiver 1120 by operating in conjunction with the GSM block 1110 and/or the NFC transceiver 1120. In addition, the application block 1140 may include a program for mobile point of sales (POS). Such a program may provide credit card purchasing and payment functions by using a mobile phone, that is, a smart phone.

The display 1160 may display images in response to display signals received from the application block 1140. The images are provided by the application block 1140 or generated by a camera embedded in the mobile device 1100. The display 1160 may include a frame buffer therein for the temporary storage of pixel values, and may be configured as a display screen in conjunction with associated control circuits.

The input/output block 1130 provides an input function to a user and provides output to be received through the application block 1140.

The memory 1150 may store program (instructions) and/or data to be used by the application block 1140, and may be realized as random access memory (RAM), read-only memory (ROM), flash memory, or the like. Thus, the memory 1150 may include volatile and non-volatile storage devices. For example, the memory 1500 may correspond to the memory device 120 described with reference to FIGS. 1 to 10.

The memory 1150 may enter a low power mode state, in which memory cell rows are refreshed, in response to the low power state entry command LPSE. The memory 1150 may automatically exit the low power mode state according to the low power mode exit latency time tXP_LPS stored in a mode register. The memory 1150 may receive the alarm signal ALRM2 instructing exit from the low power mode state, and may exit the low power mode state by receiving the low power mode exit command LPSX after the low power mode exit latency time tXP_LPS elapses from a time point of receiving the alarm signal ALRM2. The memory 1150 may receive the trigger signal TRIG instructing transition from the low power mode state to a self-refresh mode state, and may operate in the self-refresh mode state in response to the trigger signal TRIG. In addition, the memory 1150 may receive the alarm signal ALRM1 instructing exit from the self-refresh mode state, and may exit the self-refresh mode state by receiving the self-refresh exit command SRX after the self-refresh exit latency time tXP elapses from a time point of receiving the alarm signal ALRM1.

Figure 12:
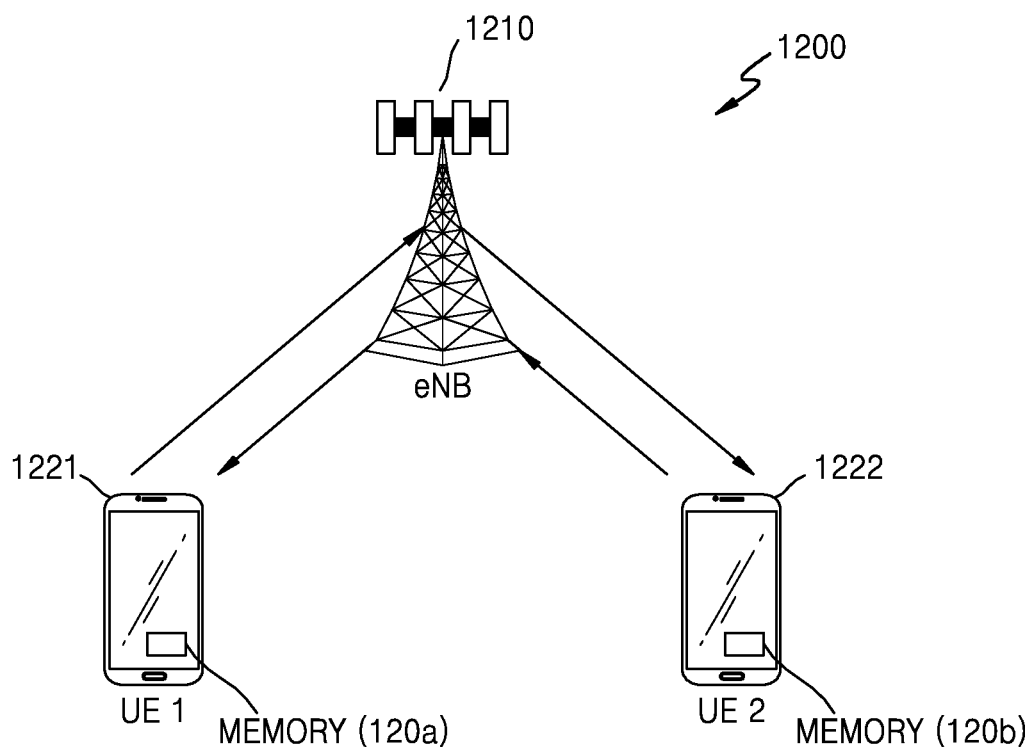
FIG. 12 illustrates an operation concept of a mobile device and a communication system, in which a memory device having a plurality of low power states is mounted, according to an exemplary embodiment.

FIG. 12 illustrates an operation concept of a mobile device and a communication system, in which a memory device having a plurality of low power states is mounted, according to an exemplary embodiment.

Referring to FIG. 12, a communication system 1200 includes a base station 1210 and a plurality of communication devices 1221 and 1222 within the cell coverage of the base station 1210. The communication devices 1221 and 1222 may refer to transmission terminals transmitting various types of information, and may refer to reception terminals receiving various types of information. In addition, the communication devices 1221 and 1222 may correspond to transceivers performing both of transmission and reception functions. In the following embodiments, each of the communication devices 1221 and 1222 will be referred to as a terminal, and may be the mobile device 1100 of FIG. 11.

The base station 1210 may correspond to a Node B, an eNode B (eNB), a base station, an access point (AP), or the like, and may be defined as a concept collectively referring to arbitrary nodes communicating with a terminal. In addition, each of the terminals 1221 and 1222 may be defined as a concept collectively referring to mobile and stationary user terminals, such as user equipment (UE), a mobile station (MS), an advanced mobile station (AMS), and the like.

The terminals 1221 and 1222 may operate in a cellular communication mode (or relay communication mode) in which the base station 1210 performs relay. In the cellular communication mode, when a first terminal 1221 transmits data to a second terminal 1222, the first terminal 1221 may transmit the data to the base station 1210 through an uplink to the base station 1210, and the base station 1210 may transmit the data to the second terminal 1222 through a downlink to the second terminal 1222.

In the cellular communication mode, a position measuring service for finding out positions of the first and second terminals 1221 and 1222 may be provided. The positions of the first and second terminals 1221 and 1222 may be found out by GPS receivers in the first and second terminals 1221 and 1222. For example, the positions of the first and second terminals 1221 and 1222 may be found out by special signals cyclically sent from the base station 1210 to the first and second terminals 1221 and 1222.

The first and second terminals 1221 and 1222 need to be awake to respond the signals cyclically sent from the base station 1210. For example, when idle states of the first and second terminals 1221 and 1222 become longer, memory devices 120a and 120b in the first and second terminals 1221 and 1222 may be in a self-refresh mode state or a low power mode state, for power saving. In this case, the memory devices 120a and 120b may be required to exit the self-refresh mode state or the low power mode state before receiving the cyclical signals sent from the base station 1210.

The memory devices 120a and 120b may perform self refresh exit in the self refresh mode state by using the first alarm signal ALRM1, and may perform low power mode exit in the low power mode state by using the second alarm signal ALRM2. The memory devices 120a and 120b may receive the first and second alarm signals ALRM1 and ALRM2 so as to exit the self-refresh mode state and the low power mode state before the cyclical signals sent from the base station 1210 are received. Thus, the memory devices 120a and 120b may stably operate without influence on the normal operation or idle state of the memory devices 120a and 120b.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements, modules or units represented by a block as illustrated in FIGS. 1 and 3 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

While the inventive concept has been particularly shown and described with reference to the exemplary embodiments thereof, it will be understood that various changes in form and details may be made therein without departing from the spirit and scope of the following claims.

What is claimed is:

1. A method of controlling a power state of a memory device, the method comprising:
   entering an idle state, in which no command is issued to the memory device;
   transitioning from the idle state to a low power mode in response to a low power state entry command, in which memory cell rows of the memory device are self-refreshed in the low power mode, operations of the memory device in the low power mode are performed according to a minimum low power mode state time; and
   transitioning from the low power mode to a self-refresh power down mode in response to a trigger signal, in which the memory cell rows of the memory device are continuously self-refreshed in the self-refresh power down mode and the self-refresh power down mode disables more circuits than those disabled in a self-refresh mode,
   wherein the low power mode has lower power consumption than the self-refresh mode and the self-refresh power down mode, and the self-refresh power down mode has lower power consumption than the self-refresh mode.

2. The method of claim 1, further comprising:
   receiving the trigger signal through one of a plurality of pins of the memory device, to which signals used for operations of the memory device are applied.

3. The method of claim 1, further comprising:
   transitioning from the self-refresh power down mode to the self-refresh mode in response to a first signal, in which the memory cell rows of the memory device are continuously self-refreshed in the self-refresh mode; and
   transitioning from the self-refresh mode to the idle state in response to a self-refresh exit command; and
   operating a valid command after an exit from the self-refresh mode,
   wherein the valid command is issued after a minimum delay time elapses from a time point of the self-refresh exit command.

4. The method of claim 1, further comprising:
transitioning from the self-refresh mode to the low power mode in response to a mode entry command.

5. The method of claim 4,
wherein the low power state entry command is same as the mode entry command.

6. A method of controlling a power state of a memory device, the method comprising:
entering an idle state, in which no command is issued to the memory device;
transitioning from the idle state to a low power mode in response to a low power state entry command, in which memory cell rows of the memory device are self-refreshed in the low power mode, operations of the memory device in the low power mode are performed according to a minimum low power mode state time;
transitioning from the low power mode to a self-refresh power down mode in response to a trigger signal, in which the memory cell rows of the memory device are continuously self-refreshed in the self-refresh power down mode;
transitioning from the self-refresh power down mode to a self-refresh mode in response to a first signal, in which the memory cell rows of the memory device are continuously self-refreshed in the self-refresh mode; and
transitioning from the self-refresh mode to the idle state in response to a self-refresh exit command,
wherein the low power mode has lower power consumption than the self-refresh mode and the self-refresh power down mode, and the self-refresh power down mode has lower power consumption than the self-refresh mode.

7. The method of claim 6, further comprising:
receiving the trigger signal through one of a plurality of pins of the memory device, to which signals used for operations of the memory device are applied.

8. The method of claim 6, further comprising:
transitioning from the self-refresh mode to the self-refresh power down mode in response to a second signal.

9. The method of claim 6, further comprising:
transitioning from the low power mode to the idle state in response to a low power mode exit command.

10. The method of claim 6, further comprising:
transitioning from the idle state to the self-refresh mode in response to a self-refresh entry command.

11. The method of claim 6, further comprising:
transitioning from the idle state to the self-refresh power down mode in response to a self-refresh power down command.

12. The method of claim 6, further comprising:
transitioning from the self-refresh mode to the low power mode in response to a mode entry command.

13. The method of claim 12,
wherein the low power state entry command is same as the mode entry command.

14. A method of operating a memory device, the method comprising:
transitioning from an idle mode to a low power mode in response to a low power state entry command, operations of the memory device in the low power mode are performed according to a minimum low power mode state time;
transitioning from the low power mode to a self-refresh power down mode in response to a first signal;
transitioning from the self-refresh power down mode to a self-refresh mode in response to a second signal;
transitioning from the self-refresh mode to the idle mode in response to a self-refresh exit command; and
transitioning from the self-refresh mode to the low power mode in response to the low power state entry command.

15. The method of claim 14, wherein memory cell rows of the memory device are automatically refreshed by using an internal counter in the memory device in the low power mode and the self-refresh power down mode.

16. The method of claim 14, further comprising:
transitioning from the idle mode to the self-refresh mode in response to a self-refresh mode entry command; and
transitioning from the self-refresh mode to the idle mode in response to the self-refresh exit command,
wherein memory cell rows of the memory device are automatically refreshed by using an internal counter in the memory device in the self-refresh mode.

17. The method of claim 16, wherein power consumption in the low power mode is lower than in the self-refresh mode.

18. The method of claim 14, wherein operations of the memory device in the low power mode are performed according to the minimum low power mode state time.

19. The method of claim 14, further comprising:
receiving a valid command after the self-refresh exit command,
wherein the valid command is received after a minimum delay time elapses from a time point of the self-refresh exit command.

20. The method of claim 14, further comprising:
transitioning from the idle mode to the self-refresh power down mode in response to a self-refresh power down command.

* * * * *